(12) United States Patent
Jiang et al.

(10) Patent No.: US 9,350,385 B2
(45) Date of Patent: May 24, 2016

(54) MODULAR AND SCALABLE CYCLIC REDUNDANCY CHECK COMPUTATION CIRCUIT

(71) Applicant: Xilinx, Inc., San Jose, CA (US)

(72) Inventors: Weirong Jiang, San Jose, CA (US); Gordon J. Brebner, San Jose, CA (US); Mark B. Carson, Belfast (GB)

(73) Assignee: XILINX, INC., San Jose, CA (US)

( * ) Notice: Subject to any disclaimer, the term of this patent is extended or adjusted under 35 U.S.C. 154(b) by 439 days.

(21) Appl. No.: 13/841,574

(22) Filed: Mar. 15, 2013

(65) Prior Publication Data

US 2014/0281844 A1 Sep. 18, 2014

(51) Int. Cl.
G06F 11/10 (2006.01)
H03M 13/00 (2006.01)
H03M 13/09 (2006.01)

(52) U.S. Cl.
CPC ............ *H03M 13/09* (2013.01); *H03M 13/091* (2013.01)

(58) Field of Classification Search
CPC .. H03M 13/09; H03M 13/091; H04L 1/0061; G06F 11/1004

USPC .......... 714/807, 758, 752, 756–757; 708/492, 708/530
See application file for complete search history.

(56) References Cited

U.S. PATENT DOCUMENTS

| | | | |
|---|---|---|---|
| 6,029,186 A | 2/2000 | DesJardins et al. | |
| 6,810,501 B1 * | 10/2004 | Ferguson et al. | ............. 714/781 |
| 7,249,306 B2 * | 7/2007 | Chen | ................... H03M 13/091 714/700 |
| 7,870,466 B2 | 1/2011 | Shigihara et al. | |
| 8,095,846 B2 * | 1/2012 | Ziesler et al. | .................. 714/758 |
| 8,468,439 B2 * | 6/2013 | Kirkpatrick | .................. 714/807 |
| 2009/0282322 A1 | 11/2009 | Wong et al. | |

* cited by examiner

*Primary Examiner* — Christine Tu
(74) *Attorney, Agent, or Firm* — Kin-Wah Tong; Diana J. Rea (57) ABSTRACT

Devices and methods for performing a cyclic redundancy check are disclosed. For example, a device has a splitter for splitting a data word into a plurality of paths. The device also has a plurality of cyclic redundancy check units. Each of the units is for processing a respective one of the paths. In addition, each of the units includes a first output port for outputting a cyclic redundancy check value for a packet ending within the unit and a second output port for outputting a cyclic redundancy check value for a packet starting or ongoing within the unit.

19 Claims, 8 Drawing Sheets

MODULAR AND SCALABLE CYCLIC REDUNDANCY CHECK COMPUTATION CIRCUIT

FIELD OF THE INVENTION

This invention relates generally to devices, e.g., integrated circuits such as field programmable gate arrays, and methods for performing cyclic redundancy check computations for packets at high data rates.

BACKGROUND OF THE INVENTION

Cyclic Redundancy Codes (CRCs) are widely used in telecommunication and networking to ensure data integrity. For example, every Ethernet packet is transmitted with an appended CRC-32 code (a 32-bit CRC code). Circuits for performing cyclic redundancy checks have been implemented serially using a shift register. However, this approach is insufficient to keep up with current data rates. In addition, while there are several CRC circuit designs for data rates up to 100 Gb/s, these generally involve using a relatively narrow data bus with input width of no more than 512 bits.

SUMMARY OF THE INVENTION

In one embodiment a device for performing a cyclic redundancy check is disclosed. For example, the device comprises a splitter for splitting a data word into a plurality of paths. The device also comprises a plurality of cyclic redundancy check units. Each of the units is for processing a respective one of the paths. In addition, each of the units comprises a first output port for outputting a cyclic redundancy check value for a packet ending within the unit and a second output port for outputting a cyclic redundancy check value for a packet starting or ongoing within the unit.

In various embodiments: a size of packets that are processed by the plurality of cyclic redundancy check units, is at least a path size of each of the paths; the device further comprises at least one combiner for combining a first cyclic redundancy check value for a packet starting or ongoing within a first one of the plurality of cyclic redundancy check units with a second cyclic redundancy check value for a packet ending within a second one of the plurality of cyclic redundancy check units; the at least one combiner is for performing an exclusive-or operation on the first cyclic redundancy check value and the second cyclic redundancy check value; the packet starting or ongoing within the first one of the plurality of cyclic redundancy check units and the packet ending within the second one of the plurality of cyclic redundancy check units are a same packet; the device further comprises at least one check circuit for checking whether at least one packet that is processed by at least two of the plurality of cyclic redundancy check units is continuous between the at least two of the plurality of cyclic redundancy check units; the check circuit determines that the packet is contiguous between the two units if a start-of-packet signal is found in a first path associated with a first unit of the two units or if the packet is ongoing in the first path, and when an end-of-packet signal is found in a second path associated with the second unit of the two units; each of the cyclic redundancy check units further comprises a splitter for splitting the one of the paths into a plurality of lanes and a plurality of cyclic redundancy check modules for calculating a partial cyclic redundancy check value of bits of a respective one of the lanes; each of the M cyclic redundancy check units further comprises a selection module for selecting a cyclic redundancy check value for output as the cyclic redundancy check value for the packet ending within the cyclic redundancy check unit; the selection unit is for selecting the intermediate cyclic redundancy check value for output as the cyclic redundancy check value for the packet ending within the cyclic redundancy check unit based on an end-of-packet signal in one of the lanes or based upon a default condition if there is no end-of-packet signal in any of the lanes; each of the cyclic redundancy check units further comprises a selection module for selecting a cyclic redundancy check value for output as the cyclic redundancy check value for the packet starting or ongoing within the cyclic redundancy check unit; the selection module is for selecting the cyclic redundancy check value for output as the cyclic redundancy check value for the packet starting or ongoing within the cyclic redundancy check unit based upon a start-of-packet signal in one of the lanes or based upon a default condition if there is no start-of-packet signal in any of the lanes; each of the cyclic redundancy check units further comprises at least one combiner for combining a partial cyclic redundancy check value from at least a first cyclic redundancy check module and a partial cyclic redundancy check value from at least a second cyclic redundancy check module to output a cyclic redundancy check value for a respective one of the lanes associated with the second cyclic redundancy check module; each of the cyclic redundancy check units further comprises at least one forwarding module for bit-forwarding at least one partial cyclic redundancy check value based upon a number of bits between a lane of the at least one forwarding module and a destination lane; the device further comprises an input port for receiving an accumulated cyclic redundancy check value from a previous data word and/or an output port for outputting an accumulated cyclic redundancy check value for a next data word; the device further comprises at least one combiner for combining the accumulated cyclic redundancy check value with at least one cyclic redundancy check value for a packet ending within at least one of the cyclic redundancy check units; the device further comprises at least one forwarding unit for bit-forwarding at least one cyclic redundancy check value based upon a number of bits between a path of the at least one forwarding unit and a destination path; the device further comprises at least one unrolling unit for unrolling at least one cyclic redundancy check value based upon a number of empty bits between an end of a packet and an end of a lane or between the end of the packet and an end of a path.

In another embodiment, another device for performing a cyclic redundancy check is disclosed. For example, the device comprises a plurality of cyclic redundancy check units for processing a data word. In one embodiment, each of the cyclic redundancy check units is for processing a portion of the data word and for outputting a respective cyclic redundancy check value. The device also includes a selection unit for selecting a plurality of the respective cyclic redundancy check values for output as final cyclic redundancy check values for a respective plurality of packets. The data word is larger than a minimum packet size.

In a further embodiment, a method for performing a cyclic redundancy check is disclosed. For example, the method comprises splitting a data word into a plurality of paths and processing each of the paths. In one embodiment, for each of the paths the processing comprises calculating a cyclic redundancy check value for a packet ending within the path and calculating a cyclic redundancy check value for a packet starting or ongoing within the path.

BRIEF DESCRIPTION OF THE DRAWINGS

Accompanying drawings show exemplary embodiments in accordance with one or more aspects of the disclosure; how

DETAILED DESCRIPTION OF THE DRAWINGS

The present disclosure relates generally to devices and methods for performing cyclic redundancy checks. For example, the present disclosure can be implemented within an integrated circuit (IC), e.g., a programmable logic device (PLD), a dedicated IC, a field programmable gate array (FPGA), and the like, to perform cyclic redundancy check operations on packets received at a high bit rate and on a wide data bus. Embodiments of the present disclosure may support data transmission rates over 100 Gb/s, e.g., from 400 Gb/s upwards using wide data bus with input widths including 1024 bits and beyond. The circuit architecture is modular and scalable, allowing resource-performance trade-offs to be offered.

Cyclic Redundancy Codes (CRC) are widely used in telecommunication and networking and many other applications to ensure data integrity. For example, Ethernet packets are transmitted with an appended CRC-32 code (a 32-bit CRC code), also referred to as a Frame Check Sequence (FCS). Circuits for performing cyclic redundancy checks have been implemented serially using a shift register. However, this approach is insufficient to keep up with current data rates. In addition, while there are several CRC circuit designs for data rates up to 100 Gb/s, these generally involve using a relatively narrow data bus with input width/word size of no more than 512 bits. This limits future throughput scaling as it becomes more difficult to obtain significant increases in clock frequency. To achieve higher throughput such as 400 Gb/s, wider data buses, e.g., with which the CRC circuit can process more than 1024 bits per clock cycle, may be used. However, because the minimum size of network packets/Ethernet frames is 512 bits, multiple packets may appear on this wide data bus at the same time. A packet can start and end at any position within the data bus. Thus, as the number of packets per word increases, it therefore becomes more complex to account for the different packet positions.

Accordingly, embodiments of the present disclosure describe a scalable CRC architecture, e.g., built upon 512-bit CRC units, e.g., optimized to a 512-bit input data width. The present embodiments provide a linear scaling of resource use as throughput increases, whereas traditional approaches involve super-linear scaling. It should be noted that although embodiments of the present disclosure are described in connection with multiples and fractions of 512 bits, the present disclosure is not so limited. Namely, an exemplary architecture features a 512-bit path size/CRC unit size, which corresponds to a current minimum Ethernet frame size, and is therefore well suited for illustrative purposes. However, those skilled in the art will appreciate that other data bus widths, frame sizes, path sizes and line sizes may be employed in accordance with the present disclosure. Thus, other embodiments of the present disclosure may accommodate different communication technologies, be optimized for different network layers, and be tailored to different packet/unit sizes, e.g., frames, packets, segments, datagrams, protocol data units (PDUs), transport data units (TDUs), session data units (SDUs), and so forth.

The cyclic redundancy check is a widely used parity bit based error detection scheme in data transmission applications and is based on polynomial arithmetic. The bits of data to be transmitted are the coefficients of the polynomial. As an example, the bit stream 1101011011 has 10-bits, representing a 10-term polynomial:

$$M(x)=1 \cdot x^9+1 \cdot x^8+0 \cdot x^7+1 \cdot x^6+0 \cdot x^5+1 \cdot x^4+1 \cdot x^3+0 \cdot x^2+1 \cdot x^1+1 \cdot x^0 = x^9+x^8+x^6+x^4+x^3+x^1+1.$$

To compute the CRC of a message, another polynomial called the generator polynomial G(x) is chosen. G(x) should have a degree greater than zero and have a non-zero coefficient in the $x^0$ term. This results in several possible options for the generator polynomial, hence the need for standardization. CRC-16 is one such standard that uses the generating polynomial:

$$G(x)=x^{16}+x^{15}+x^2+1.$$

CRC-16 detects all single and double errors, all errors with an odd number of bits, all burst errors of length 16 or less, and most errors for longer bursts. Another standard CRC is CRC-32, which uses the generating polynomial:

$$G(x)=x^{32}+x^{26}+x^{23}+x^{22}+x^{16}+x^{12}+x^{11}+x^{10}+x^8+x^7+x^5+x^4+x^2+x+1.$$

In general, an n-bit CRC is calculated by representing the data stream as a polynomial M(x), multiplying M(x) by $x^n$ (where n is the degree of the polynomial G(x)), and dividing the result by the generator polynomial G(x). The resulting remainder is appended to the data stream and transmitted. The complete transmitted polynomial is then divided by the same generator polynomial at the receiver end. If the result of this division has no remainder, there are no transmission errors. Mathematically, this can be represented as:

$$CRC = \text{remainder of } [(M(x) \cdot x^n)/G(x)].$$

IEEE 802.3 defines the polynomial M(x) as the destination address, source address, length/type, and data of a frame, with the first 32-bits complemented. The remainder from the calculation of CRC above is complemented, and the result is the IEEE 802.3 32-bit Frame Check Sequence (FCS) field. The FCS is appended to the end of the Ethernet frame, and is transmitted highest order bit first ($x^{31}, x^{30}, \ldots, x^1, x^0$).

In one embodiment, the present disclosure employs matrix operations on various portions of the incoming data according to the generating polynomial to generate partial, intermediate and final CRCs. Several useful properties of cyclic redundancy codes (CRCs) are used in the present embodiments, for example:

PROPERTY 1: CRC(A xor B)=CRC(A) xor CRC (B);
PROPERTY 2: CRC($\{X,0^P\}$)=$H^P$·CRC (X);
where $0^P$ is P-bit zeros, $\{X,0^P\}$=X with P zeros appended, $H^P$ is a matrix derived from the generating polynomial; and
PROPERTY 3: CRC($\{0^P,Y\}$)=CRC (Y).

As an example, an incoming data word, D, may comprise 1024 bits. In order to calculate the cyclic redundancy code (CRC) for D, the data can be described as D=[bit 1023 . . . bit 0]=E[D1|$0^{512}$] xor F [$0^{512}$|D2], where D1=[bit 1023 . . . bit 512] and D2=[bit 511 . . . bit 0]. Thus, CRC (D)=CRC (E) xor CRC (F), according to property 1. CRC (F) can be calculated by simply calculating the CRC for D2 according to property 3. In other words, the CRC (F) calculation can be performed with respect to only 512 bits of D2, rather than on all 1024 bits of F. CRC (E) can be calculated according to property 2 as follows. First, calculate the CRC for D1. Second, multiply CRC(D1) by the matrix derived from the generating function, $H^P$, with CRC (E) as the result. Once CRC(E) and CRC(F) are known, CRC(D) is computed as CRC (D)=CRC (E) xor CRC (F).

The utility of these various properties and transformations are discussed below in connection with various components and features. In particular, embodiments of the present disclosure feature a CRC circuit that employs parallel CRC units and parallel paths. Each path includes a CRC unit with which each processes a portion of an incoming data word to generate two CRC outputs, which may then be combined with CRC output(s) from one or more of the other units to produce final CRC values for one or more packets ending within the data word.

Figure 1:
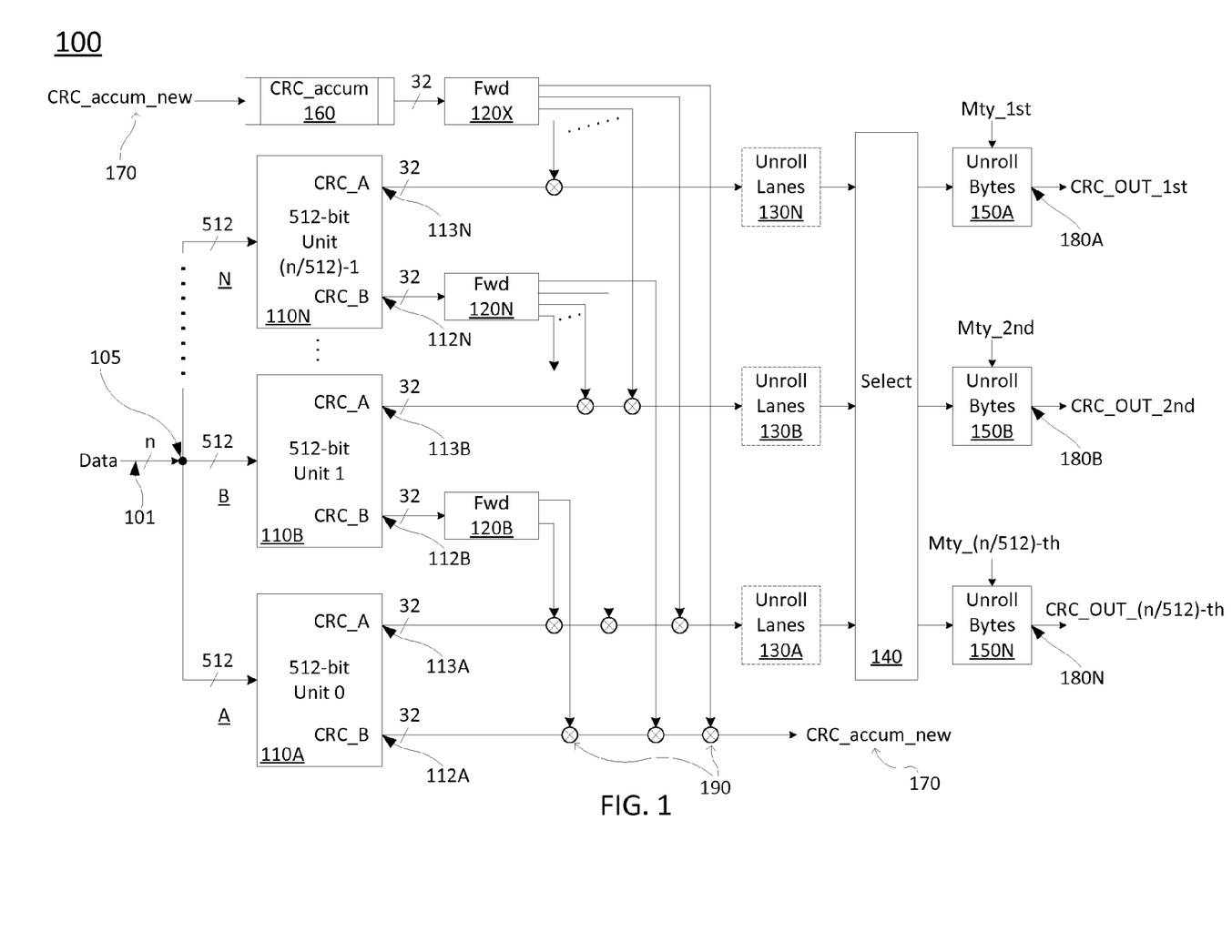
- FIG. 1 illustrates a block diagram of a CRC circuit/device implementation.

FIG. 1 illustrates a block diagram of a device, or a CRC circuit 100 according to an embodiment of the present disclosure. As illustrated in FIG. 1, CRC circuit 100 is divided into N paths, where each path includes a 512-bit wide computation block (broadly an n-bit wide computation block), e.g., each having a 512-bit CRC unit 110A, 110B . . . 110N respectively. In various embodiments, each 512-bit CRC unit comprises four lanes, each lane having a 128-bit CRC computation module, which is illustrated in greater detail in FIGS. 2 and 3 respectively. It should be noted that four 128-bit lanes are shown for illustrative purposes only. Thus, the present disclosure is not limited to any number of lanes or any particular lane size. In addition, in one embodiment a different type of CRC unit architecture might be used, for example, a more monolithic block based upon wide (up to 549-bit) Exclusive OR gates. Thus, such an alternate architecture for any one or more of CRC units 110A-110N may be incorporated into CRC circuit 100 without altering its basic function.

In one embodiment, CRC circuit 100 comprises N number of 512-bit paths A, B and N (only three paths are illustrated in FIG. 1). Hence, the incoming data on input port 101 may comprise a 1536-bit wide data bus. A splitter 105 splits the signals on the data bus into the respective 512-bit paths A, B and N. In one embodiment, serial data is converted to a parallel data word prior to entering CRC circuit 100. Thus, in one embodiment "earlier" bits may be placed on the bus from the top of the circuit towards the bottom of the circuit where "later" bits are processed.

According to embodiments of the present disclosure, the width of the data word is N-bit. Because a minimum size Ethernet packet is 64-byte (i.e., 512-bit), there are up to (N/512) packets ending in the same word. Thus, there are up to (N/512) CRC outputs for each word. Accordingly, in FIG. 1, there are potentially three CRC outputs, e.g., on output ports 180A, 180B and 180N, since up to three 512-bit Ethernet frames may end within the same 1536-bit data word. For example, the n-th CRC output 180N is for the n-th completed packet on the same N-bit input data word (n=N/512).

Each 512-bit CRC unit 110A-110N generates two cyclic redundancy codes: one for a packet ending within the unit/path (e.g., CRC_A on CRC output ports 113A-113N) and the other for a packet starting or ongoing within the unit/path (e.g., CRC_B on CRC output ports 112A-112N). A register 160 stores an accumulated CRC value (CRC_accum_new 170) for packets spanning multiple words.

Figure 2:
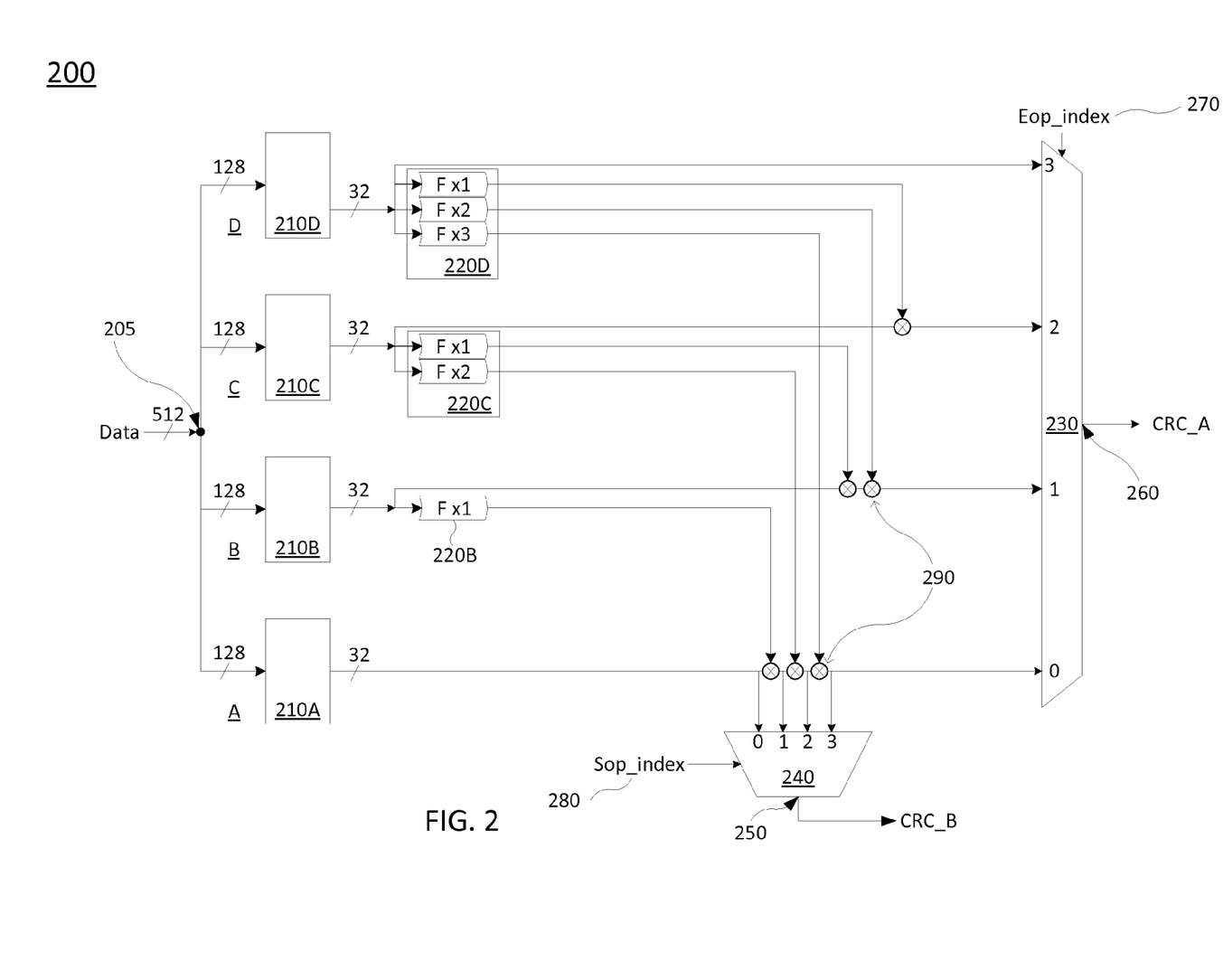
FIG. 2 illustrates a block diagram of a CRC unit.
Figure 3:
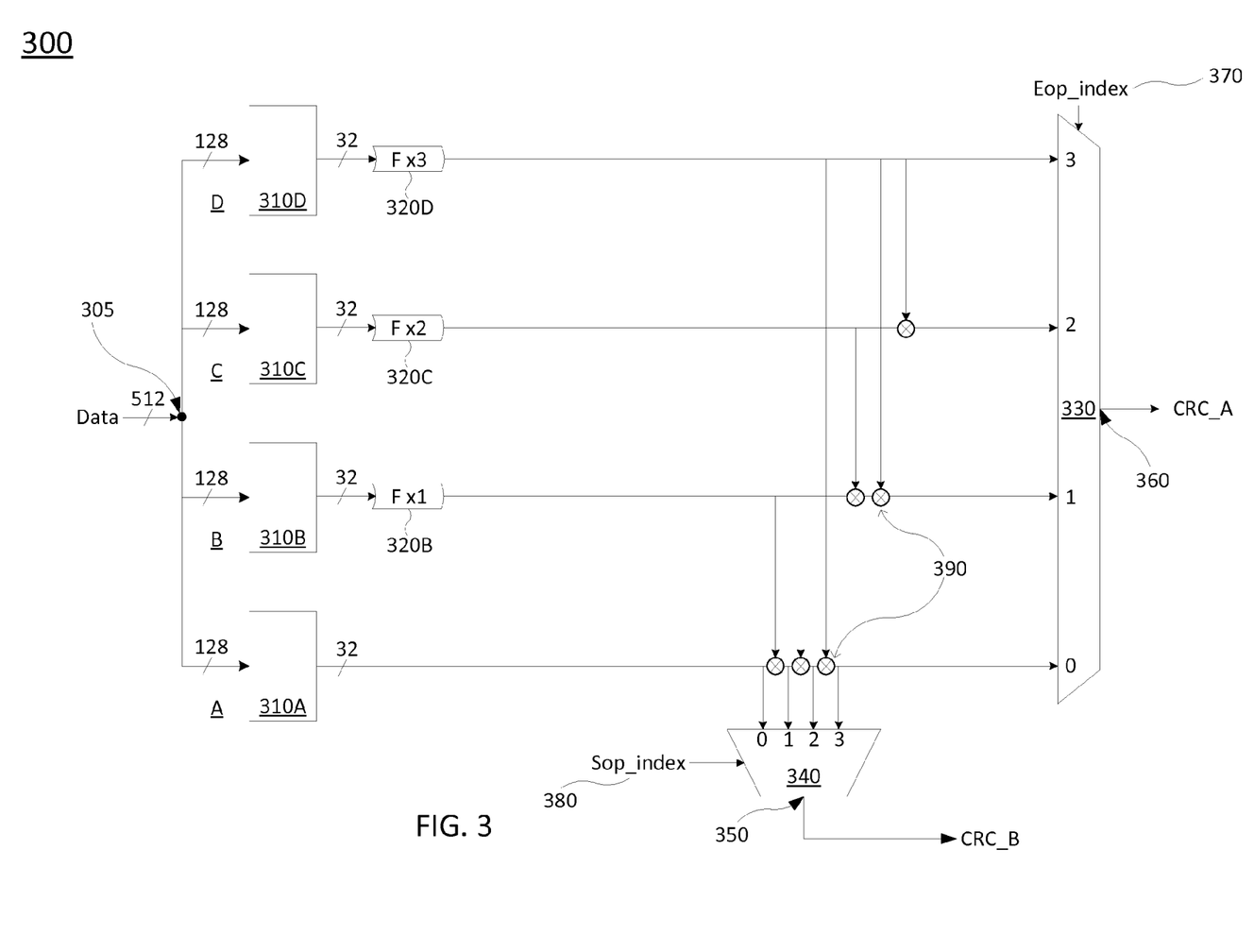
FIG. 3 illustrates a block diagram of an alternate embodiment of a CRC unit.

In parallel CRC computation, zeros may be appended to the data for computing partial CRCs. These appended zeros are called "empty bits". Thus, various embodiments also correct for additionally-accumulated zeros at the end of the packet, either to 128-bit boundaries (e.g., using CRC circuits as shown in FIG. 2) or 512-bit boundaries (e.g., using CRC circuits as shown in FIG. 3). Each of these approaches is also applicable when no end adjustment is needed, for example if the original packet is zero-padded at the beginning, to end-align it with a 128-bit or 512-bit boundary. In one embodiment, further operations that account for empty bits and/or zero padding can also be implemented following processing in each of the CRC units 110A-110N. For example, the "Fwd" blocks, forwarding units 120B, 120N and 120X, forward a CRC value by different numbers of empty bits. The lane unrolling units 130A-130N and byte unrolling units 150A-150N unroll a CRC by different numbers of empty bytes. The "forwarding" and "unrolling" functions will be described in greater detail below following discussion of exemplary CRC units 200 and 300 of FIGS. 2 and 3.

In one embodiment, the incoming data (e.g., Ethernet frame(s), which may also be referred to herein as packets) on the N-bit data bus includes (N/L)-bit start-of-packet (SoP) and end-of-packet (EoP) signals. In one embodiment, the size of the SoP and EoP signals is N/L bits. Within the entire CRC circuit 100 there are N/L lanes. Accordingly, in one embodiment the SoP signal or EoP signal indicates if a packet (or frame, PDU, etc.) starts or ends at the corresponding lane and where within the lane the frame ends. If a SoP signal or EoP signal is detected for a lane, a SoP or EoP flag corresponding to the lane is set e.g., a single bit is set to one "1" to indicate for a particular lane that a SoP signal was detected and if no SoP signal is detected on the data in the lane, then the SoP flag may remain a zero "0". In one embodiment, it is assumed that the start of a packet must be aligned with the start of a lane. In one embodiment, the end of a packet may not be aligned with the end of a lane. However, in one embodiment, the end of the packet is assumed to be aligned with the end of a byte. Thus, a lane contains L/8 bytes and a packet may end at any byte within the ending lane. In one embodiment, an Mty ("empty") value is calculated to indicate the number of empty bytes within a lane. In one embodiment, the Mty value is calculated based upon a detection of an EoP signal within a particular byte and a determination of the number of additional bytes within the lane below the position of the byte where the EoP signal is detected. The number of bits required to store the Mty value is given by size_Mty=(N/512)*Log 2(L/8)-bit. Because the minimum-size Ethernet packet is 512-bit, up to (n=N/512) packets may be contained in the same word. Thus, the n-th Mty is for the n-th completed packet.

FIG. 2 illustrates an exemplary embodiment of a 512-bit CRC unit 200 where L=128 (i.e., where the lane width is 128-bits). For example, CRC unit 200 may be implemented as each of the CRC units 110A-110N in FIG. 1. As shown in FIG. 2, the CRC unit 200 includes four CRC modules 210A-210D. Each of the modules computes a CRC value on the data on each L-bit lane A-D. The CRC value on each L-bit lane is referred to herein as a partial CRC value. The forwarding units 220B, 220C and 220D include "Fxi" modules for forwarding the partial CRC value by "i" lanes. For example, as shown in FIG. 2, forwarding unit 220C includes a Fx2 module, which forwards the partial CRC value for lane C by two lanes, i.e., to lane A. As shown in FIG. 2, each of the forwarded partial CRC values is combined with a partial CRC value of the destination lane. For example, several combiners 290 are shown in FIG. 2, each of which is for performing, e.g., an exclusive-or operation, on the partial CRC values which it takes as inputs.

In addition to forwarding the partial CRC values, each of the forwarding units 220B-220D "forwards" a partial CRC value based upon a number of bits corresponding to the destination lane, prior to forwarding/sending the partial CRC value to a particular destination lane. It should be noted that the operation of bit-forwarding is a data manipulation/operation on the CRC value, in contrast to the "forwarding" (e.g., sending and/or outputting), of the resulting CRC value to other lanes and/or to the selection modules, e.g., multiplexers 230 and 240. For example, the Fx2 module of forwarding unit 220D in lane D will forward the partial CRC value based upon 256 bits (the number of bits corresponding to two lanes) and send the resulting partial CRC value to lane B, where it is combined at a combiner 290 via an exclusive-or operation with the partial CRC value of lane B. In one embodiment, the forwarding comprises a matrix transformation of the input CRC value based upon the generating function and the distance (number of bits) to the destination lane. The CRC value output following the last combiner of a particular lane comprises one of the inputs to multiplexer 230. Each of the forwarding modules in each of the forwarding units 220B-220D operates in a similar manner. CRC values comprising combinations of partial CRC values from various lanes comprise the respective inputs to multiplexers 230 and 240.

The "EoP_index" signal 270 specifies the index of the lane where a packet is ending (e.g., a lane having a corresponding EoP bit/flag set to one "1" to indicate that a packet ends in that lane). The EoP_index signal 270 controls which of the inputs to multiplexer 230 is output on output port 260 as CRC_A (a CRC value for a packet ending within the 512 bits that are processed by CRC module 200). In other words, the multiplexer 230 selects which input CRC value to output as CRC_A based upon the value of EoP_index. Similarly the "SoP_index" signal 280 specifies the index of the lane where a packet is starting (i.e., the corresponding SoP bit/flag for the lane is set to one "1"). The default values for EoP_index and SoP_index are 0 and (512/L−1), respectively. The SoP_index signal 280 controls which of the input CRC values to multiplexer 240 is output on output port 250 as CRC_B (a CRC value for a packet starting or ongoing within the CRC unit 200). In other words, multiplexer 240 selects which input CRC value to output as CRC_B based upon the value of SoP_index.

Returning to a discussion of FIG. 1, further components and features of CRC circuit 100 will now be described. As mentioned above, a packet is assumed to begin at the start of a lane. However, in one embodiment a packet may end at any lane within a path and at any position within a lane (assumed to end at the end of a byte). Accordingly, in one embodiment byte unrolling units 150A-150N are included in CRC circuit 100 to account for packets which do not end on the end of a lane. As mentioned above, in one embodiment an Mty ("empty") value is calculated to indicate the number of empty bytes within a lane. The Mty value may be calculated based upon a detection of an EoP signal within a particular byte and a determination of the number of additional bytes within the lane below the position of the byte where the EoP signal is detected. The number of bits required to store the Mty value is given by size_Mty=(N/512)*Log 2(L/8)-bit. Because the minimum-size Ethernet packet is 512-bit, up to (n=N/512) packets may be contained in the same word. Thus, the n-th Mty is for the n-th completed packet. As shown in FIG. 1, $Mty\_1^{st}, Mty\_2^{nd} \ldots Mty\_(n/512)^{th}$ are inputs to byte unrolling units 150A-150N, respectively. As an example, $Mty\_1^{st}$ may have a value of 7. This indicates that a packet ended at byte 9 of a lane and that the last seven bytes of the lane should be treated as zeros/empty bytes.

In one embodiment, to "unroll" or "unwind" a CRC according to an Mty value, a matrix transformation of the input CRC value based upon the generating function and upon the value of Mty (number of bits) is performed. In another embodiment, a pipelined unrolling operation may be implemented in any one or more of byte unroll units 150A-150N. In one embodiment, a pipeline comprises i stages, where the i-th stage is for unrolling $2^i$ bytes. Thus, in one embodiment four pipeline stages are needed to unroll up to 16 bytes. In another embodiment, an iterative function is performed. For example, in one embodiment the least significant bit of the CRC value is removed. If the bit is a one "1", the divisor (i.e., the generating polynomial/generating function) is added to the resultant CRC value. However, if the removed bit is a zero "0", then zeros are added to the resultant CRC value. This operation is iterated for the number of bits as indicated by the Mty value. For instance, if the value of $Mty\_1^{st}$ is 2 (2 bytes, or 16 bits), the unroll operation is performed 16 times to compute a final CRC value. In still another embodiment, a different unrolling algorithm may be utilized. In other words, the present disclosure is not limited to any one particular unrolling algorithm.

When each of the CRC units 110A-110N of CRC circuit 100 comprises a CRC unit such as unit 200 of FIG. 2, then lane unroll units 130A-130N may be omitted from circuit 100. However, in one embodiment these lane unroll units are included in circuit 100 where the CRC units maintain packet alignment to the end of a 512-bit path. An exemplary CRC unit that aligns to the end of a path is shown in FIG. 3.

FIG. 3 illustrates a CRC unit 300 according to one embodiment. For instance, any one or more of CRC units 110A-110N of FIG. 1 may comprise a CRC unit 300. As shown in FIG. 3, CRC unit 300 shares many similarities to CRC unit 200 of FIG. 2. For example, CRC unit 300 has a 512-bit input port/bus and a splitter 305 for splitting the 512 bits into four 128-bit lanes A-D. Each of the lanes A-D includes a CRC module 310A-310D, respectively. However, in contrast to FIG. 2, the forwarding units 320B-320D of FIG. 3 perform only a single bit-forwarding operation prior to outputting/forwarding the CRC value. For example, forwarding unit 320D may forward the bits in the CRC value based upon 384 bits (a three-lane forwarding) assuming a destination lane of lane A, to the final lane of the path. Note that although the packet may indeed end on lane A, it need not. For example, the packet may still end on lane B. Similarly, forwarding unit 320C may "forward" the bits of the partial CRC output by CRC unit 310C based upon 256 bits, also assuming a destination of lane A, the final lane of the path. The bit-forwarding in this manner essentially aligns the packet with the end of the path/end of CRC unit 300. However, since this assumption may be incorrect, the alignment of the packet to the end of the path may be corrected in lane unroll units 130A-130N of the CRC circuit 100 in FIG. 1. Additional components of CRC unit 300 function in a similar manner to those of CRC unit 200 in FIG. 2. For example, selection module/multiplexer 330 selects an input partial CRC value to be output as CRC_A on output port 360 based upon the end-of-packet EoP_index value 370. Similarly, selection module/multiplexer 340 selects an input CRC value to be output as CRC_B on output port 350 based upon the start-of-packet SoP_index value 380. In addition, each of the combiners 390 has the same function as the combiners 290 in FIG. 2.

Returning to CRC circuit 100 of FIG. 1, lane unroll units 130A-130N may be included when using CRC units that align to the end of a 512-bit path. For example, assume CRC unit 110B in FIG. 1 comprises the CRC unit 300 of FIG. 3. If a packet ends on lane C (the second lane) of the CRC unit 300, the multiplexer 330 will select input 2 (from lane C) as the output CRC_A. However, the forwarding units 320D and 320C will have essentially "over-forwarded" their respective CRC values by two (2) too many lanes. Thus, lane unroll unit 130B may unroll the intermediate CRC value it receives as an input by two lanes (256-bits). The lane unroll unit may be based upon the same or a similar design as the byte unroll units 150A-150N, previously described. For example, the unroll operation may comprise a matrix manipulation of the input CRC value based upon the generating function and the number of empty bits corresponding to the number of empty lanes. In one embodiment, the lane unroll units determine the number of lanes to unroll based upon the EoP_index value of the corresponding lane. For instance, following the same example above, if the packet ends on lane B, EoP_index=2. Thus, the lane unroll unit will unroll based upon the number of bits corresponding to two (2) lanes (256 bits). Note that since the packet may still have ended within the middle of lane B, the CRC value should still be unrolled by the number of empty bytes within the ending lane in one of byte unroll units 150A-150N.

Figure 4:
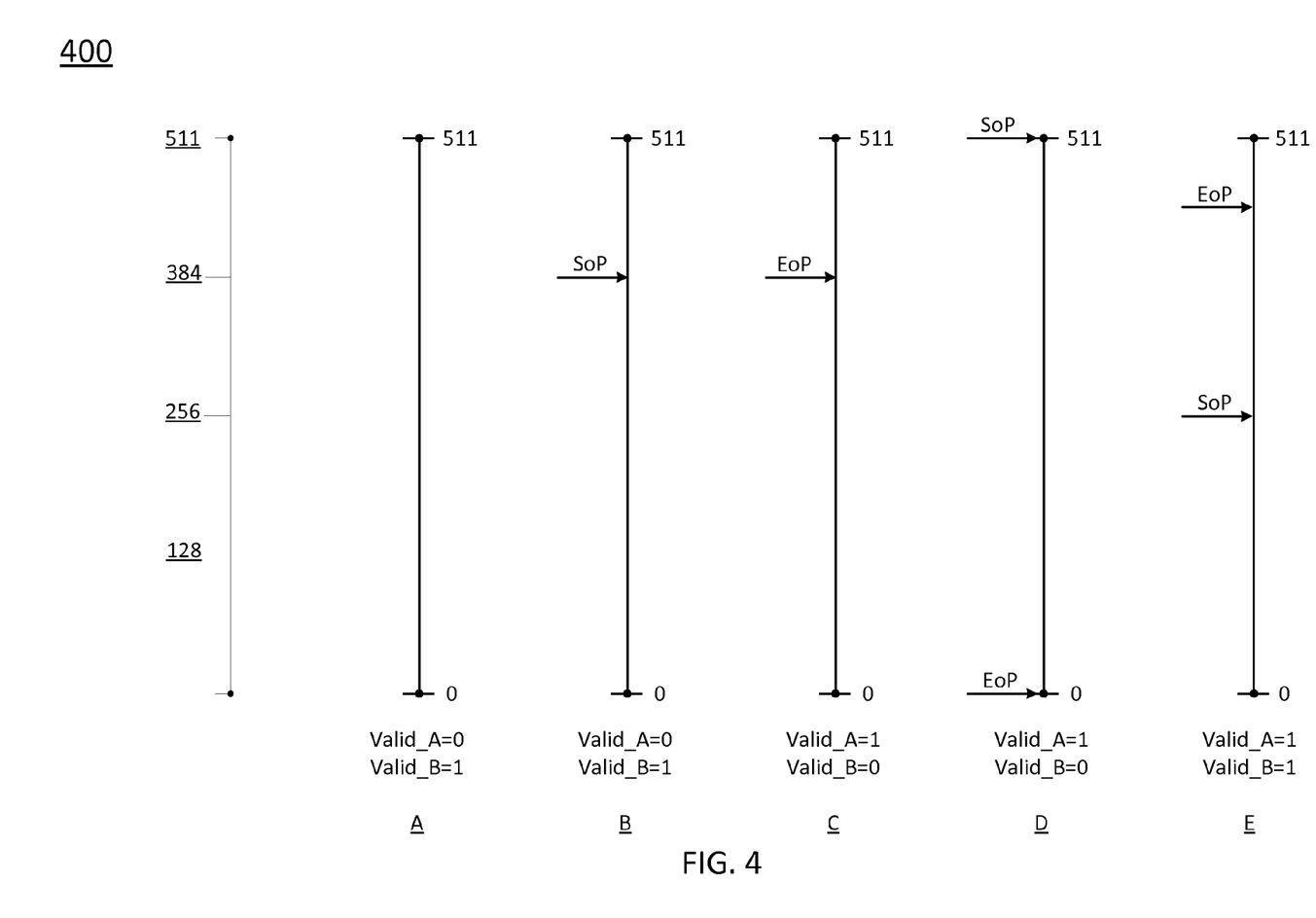
FIG. 4 illustrates a timing diagram for exemplary scenarios for bits processed on a path and/or through a CRC unit.

Further functions of the CRC circuit 100, in particular the functions of forwarding units 120B, 120N and selection unit 140, may be illustrated using the examples of FIG. 4. In particular, FIG. 4 illustrates a timing diagram 400 with various scenarios for a 512-bit input that may be processed by a CRC module according to embodiments of the present disclosure. For example, each of the five examples A-E represents 512 bits which may be received/processed in any one clock cycle. It should be noted that in these examples, bit 511 is an "earlier" bit and bit 0 is a "later" bit in the data stream. For example, a CRC circuit such as circuit 100 of FIG. 1 may comprise just one component of a transceiver. In one embodiment, the transceiver transmits and/or receives serial data that is then converted to parallel data for faster processing by the CRC circuit and other components of the transceiver. Thus, as the data is received serially, it may be placed in successive parallel bit positions of a data word (which may then be split by the CRC circuit into several paths for processing by several 512-bit CRC units, as described above). In example A, there is no SoP or EoP signal that is received in the path (i.e., within 512 bits processed by the 512-bit CRC unit). This may be due to two reasons: either there is no packet/data on the path, or the packet is ongoing through the path (for example, where the packet is greater than 512 bits, the packet may begin and end on different paths that are processed by other 512-bit CRC units). In any case, since there is no packet that is ending within the path, Valid_A is set to zero "0", to indicate that the CRC_A output for packets ending within the path is not a valid output. On the other hand, Valid_B is set to one "1" to indicate that the CRC_B output for packets that start or continue within the path is a valid output.

In example B, a SoP signal is found within the 512 bits, but there is still no EoP signal found. Thus, there is a packet that begins in the path, but no packet ends within the path. As such, Valid_A is set to zero "0" and Valid_B is set to one "1". In example C, an EoP signal is found within the 512 bits, but there is no SoP signal. Accordingly, Valid_A is set to one "1", to indicate that the CRC_A output for packets ending with the path is valid (since a packet ends within the path as indicated by the EoP signal). However, Valid_B is set to zero "0" to indicate that the CRC_B output for packets that start or continue within the path is an invalid output.

In example D, both a SoP and an EoP signal are found within the 512 bits. Although both a SoP and an EoP signal are found within the 512 bits, only the Valid_A is set to one "1". This is because the EoP is found after the SoP, clearly indicating that the EoP is ending in the same packet that begins with the SoP signal. As such, the output CRC_B is invalid, and thus should not be combined with any other CRC values from any other CRC units because the packet has ended within the path. In example E, again both a SoP and an EoP signal are found in the 512 bits. However, the EoP signal is earlier than the SoP signal which indicates that the EoP signal is for a packet that continued from another CRC unit/path, but which ends within the current path, whereas the SoP signal is for the start of a new packet. Thus, Valid_A is set to one "1" to indicate that CRC_A, the CRC value for packets ending within the path, is valid. Likewise, Valid_B is set to one "1" to indicate that CRC_B, the CRC value for packets that start or are continuous through the unit, is valid as well.

Referring now to FIG. 1 in conjunction with FIG. 4, the data bus of circuit 100 may comprise a 1536-bit word which is split into three 512-bit paths. As an example, the earliest path (path N) comprises the 512 bits as shown in example B of FIG. 4, the middle path (path B) comprises the 512 bits of example E, and the last path (path A) comprise the 512 bits of example C. As such, CRC unit 110N of path N processes the bits on the data path to generate CRC_A and CRC_B. In addition, Valid_A is set to zero "0" and Valid_B is set to "1". Accordingly, the CRC_A output by CRC unit 110N should not be used. The purpose of selection unit 140 is to choose valid CRC values to be output as one or more final CRC values on output ports 180A-180N. Thus, based upon a Valid_A signal/flag for path N being zero "0", i.e., invalid, the selection unit 140 may ignore, or not select, the CRC value that is output as CRC_A of CRC unit 110N to be output as a final CRC value. The purpose of forwarding units 120B and 120N is to forward intermediate CRC values for a packet which does not end within the current path to be combined with an intermediate CRC value from another path/CRC unit where the packet ends. Thus, since Valid_B is set to "1", i.e., is valid, the forwarding unit 120N may output/send CRC_B to be combined with the outputs of other CRC units.

It should be noted that forwarding unit 120N, as well as forwarding units 120B and 120X, function in a similar manner to the forwarding units shown in FIGS. 2 and 3. Thus, for instance, where forwarding unit 120N is forwarding CRC_B by one lane (e.g., to lane B), it will forward based upon 512 bits (the distance, in bits, to the destination lane), and if forwarding two lanes (e.g., to lane A), it will forward based upon 1024 bits.

At the same time as processing occurs on path N, CRC unit 110B in path B processes the 512 bits as shown in example E of FIG. 4. CRC unit 110B generates CRC values for output as intermediate CRC values CRC_A and CRC_B. In addition, an EoP signal is found followed by a SoP signal. As such Valid_A and Valid_B are both set to one "1". Notably, forwarding unit 120N will output/send CRC_B from path N to path B (as described above Valid_B=1 for CRC unit 110N/ path N). Thus, CRC_B from CRC unit 110N is combined at a combiner 190, e.g., executing an exclusive-or operation, with CRC_A from CRC unit 110B. The combined CRC value is then received by the unroll unit 130B and the selection unit

140. In addition, selection unit 140 will choose the combined CRC value on path B to be output as a final CRC value. For example, selection unit 140 may consult the Valid_A signal for path B, which is set to "1" to indicate that a packet has ended within the current CRC unit 110B, or along the path B.

In addition, a new packet also begins within the data on path B. Since Valid_B is also set to one "1", the forwarding unit 120B forwards CRC_B along the connections indicated in FIG. 1.

In CRC unit 110A, the 512 bits of example C of FIG. 4 are processed and CRC_A and CRC_B are output. An EoP signal is found within the data on the path A. Thus, Valid_A=1 while Valid_B=0. The value of CRC_A of CRC unit 110A is combined at a combiner 190, e.g., executing an exclusive-or operation, with the CRC_B value from CRC unit 110B. The combined CRC value is then received by the unroll unit 130A and selection unit 140. Since Valid_A=1, selection unit 140 will allow the combined CRC value along path A to be output as a final CRC value. Notably, in this example two CRC values are output in parallel as final CRC values by the selection unit 140 for a single 1536-bit word.

Although the foregoing example illustrates several features and advantages of the present embodiments, it should also be noted that in some instances a packet may span multiple words. To account for this situation, an output of the last path in the CRC circuit (e.g., path A in CRC circuit 100 of FIG. 1) is used as seed CRC value for a next data word to be processed in a later cycle. As shown in FIG. 1 the value CRC_accum_new 170 comprises the input to the CRC_accum register 160. Thus, for example, for a packet that starts in path B of the CRC circuit 100 and ends within a next data word, forwarding unit 120B will forward the CRC_B value from CRC unit 110B to be combined with both CRC_A and CRC_B of CRC unit 110A. CRC_B from the above path B is combined with CRC_A of unit 110A. However, since the packet does not end on path A, CRC_A of CRC unit 110A will be invalid (Valid_A=0) and the selection unit 140 simply ignores this combined CRC value. On the other hand, CRC_B from unit 110B is combined (e.g., via exclusive-or) with CRC_B from unit 110A and this combined CRC value is valid and is the seed CRC value, CRC_accum_new 170, for the next data word.

It should also be noted that where Valid_B=1 for a particular CRC unit/path, the forwarding unit of the path may forward a CRC_B value to more than one other path. For example, forwarding unit 120N may forward a CRC_B value of CRC unit 110N to both paths B and A. However, the packet that starts or continues on path N may end on path B, and not on path A. Consequently, the CRC_B value of path N should only be combined with the output CRC_A value of unit 110B of path B and should be ignored on path A. To accomplish this purpose, in one embodiment CRC circuit 100 may further include a contiguous check circuit.

Figure 5:
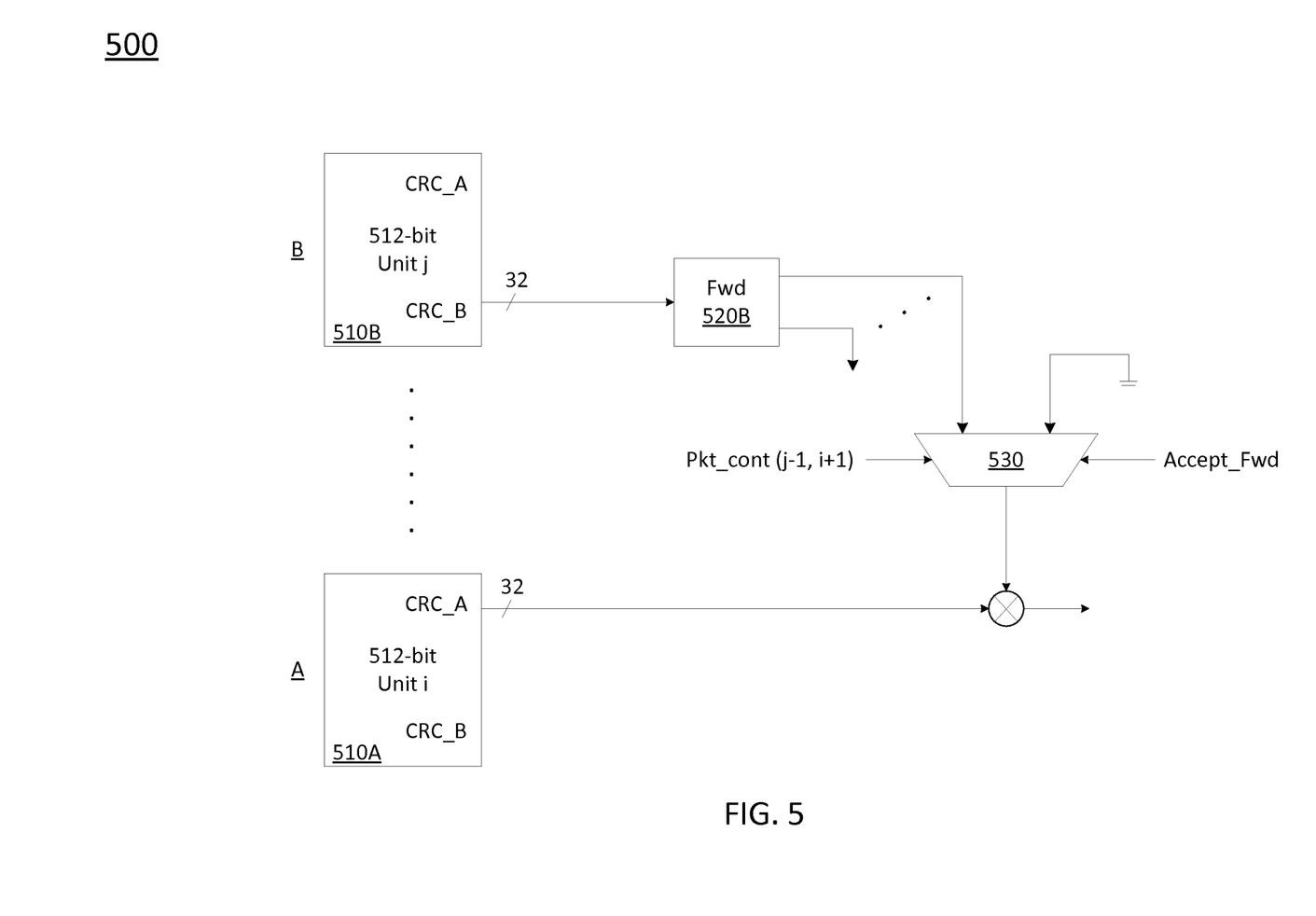
FIG. 5 illustrates a block diagram of a check circuit for checking whether a packet is contiguous between two CRC units.

FIG. 5 illustrates an example of a check circuit 500 for checking whether a packet is contiguous between adjacent paths/CRC units. As shown in FIG. 5, there are two adjacent CRC units 510A and 510B in paths A and B, respectively. A check unit 530 is located between the output of forwarding unit 520B and the destination lane A. In one embodiment, the check unit comprises a multiplexer. In one embodiment, one of the inputs to check unit 530 comprises the output of forwarding unit 520B and the other input comprises ground (e.g., a zero "0"). In addition, in one embodiment, the check unit 530 is controlled by the "packet continuous" control signal Pkt_cont (j−1, i+1).

The forwarded CRC_accum or CRC_B may not be combined with CRC_A of a Unit i, if the packet ends above Unit i. For example, the forwarded CRC_B from Unit j will be combined with CRC_A of Unit i, if the packet is contiguous between Unit (j−1) and Unit (i+1). In addition, the forwarded CRC_accum will be combined with CRC_A of Unit i, if the packet is contiguous between the top unit and Unit (i+1). Similarly the forwarded CRC_accum or CRC_B may not be used to generate the new CRC_accum, if the packet ends within the current data word. For example, the forwarded CRC_B from Unit j will be used for accumulation, if the packet is contiguous between Unit (j−1) and Unit 0. The forwarded CRC_accum (from last data word) will also be used for accumulation, if the packet is contiguous between the top unit and Unit 0. In one embodiment, it is determined whether the packet is contiguous between units by looking at the SoP and EoP bits between them. Accordingly, as shown in FIG. 5, the check unit 530 determines if the forwarded CRC (CRC_B) should be transferred where Pkt_cont(j−1,i+1) is the signal generated based on the SoP and EoP signals to indicate whether the packet is contiguous between Unit (j−1) and (i+1) (e.g., between units 510A and unit 510B, respectively). It should be noted that a number of similar check units may be located between different paths to perform different continuity checks in a similar manner.

Figure 6:
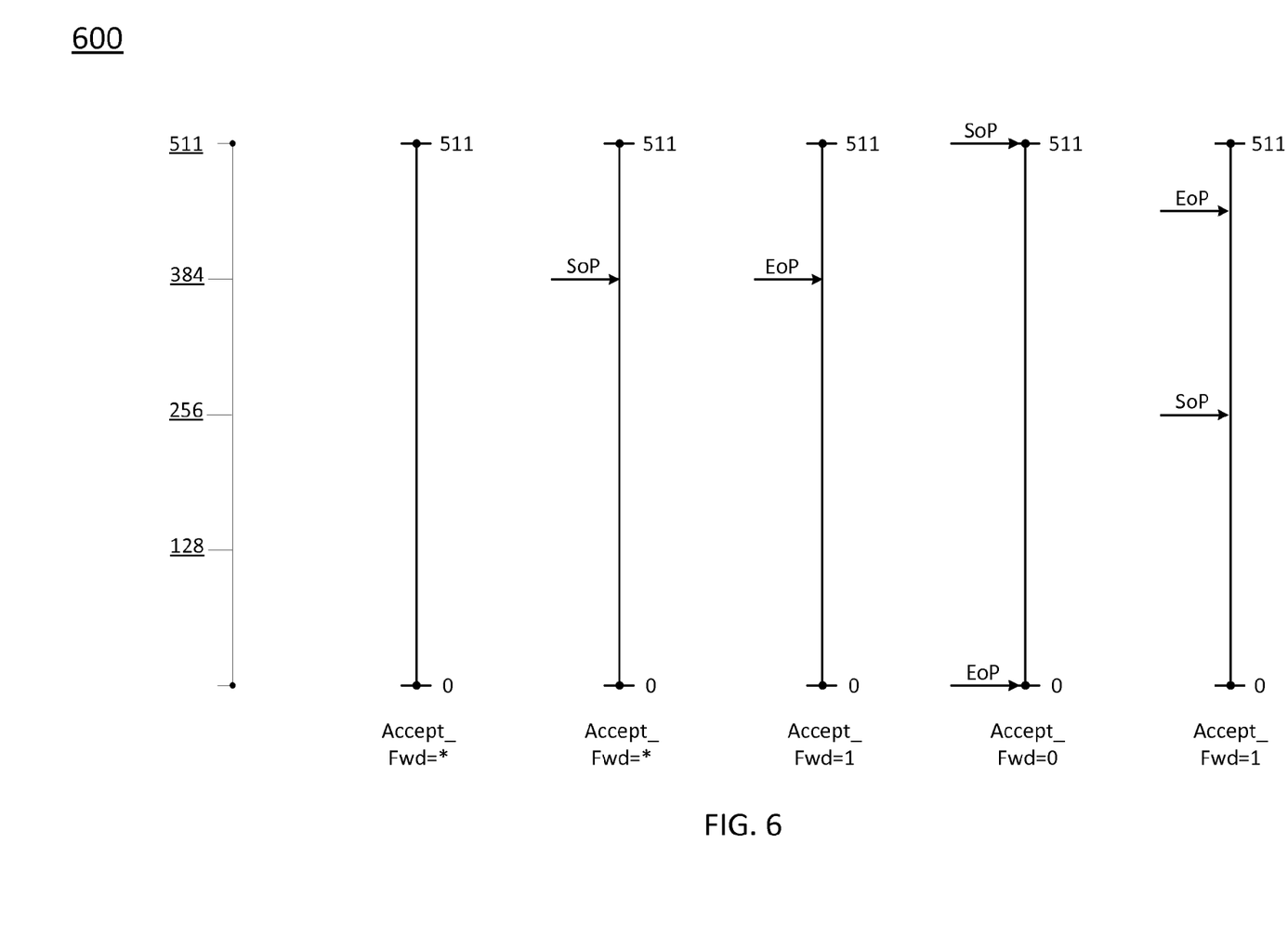
FIG. 6 illustrates a timing diagram for further exemplary scenarios for bits processed on a path and/or through a CRC unit.

As well as deciding whether a forwarded CRC should be transferred to a unit, in one embodiment it is also necessary to decide whether a unit wants to accept the forwarded CRC(s). In the case that a packet starts and ends within a same unit, the CRC_A of this unit does not need to be combined with any forwarded CRC. FIG. 6 illustrates a timing diagram 600 with several exemplary scenarios for bits processed on a path and/or through a CRC unit and the determination as to whether a forwarded CRC value should be accepted. In one embodiment, the SoP and EoP signals that may be present within a path can determine whether the unit/path should accept forwarded CRCs from the higher units and from the CRC_accum register. Here "*" means "don't care", because in these cases the CRC_A output of the unit is invalid. In one embodiment, the "accept forward" Accept_Fwd signal comprises a single bit, which may be used as an additional control signal to the check unit 530 in FIG. 5. In another embodiment, a separate control logic may be situated in the same path to accomplish the forwarding or blocking according to the Accept_Fwd signal.

Figure 7:
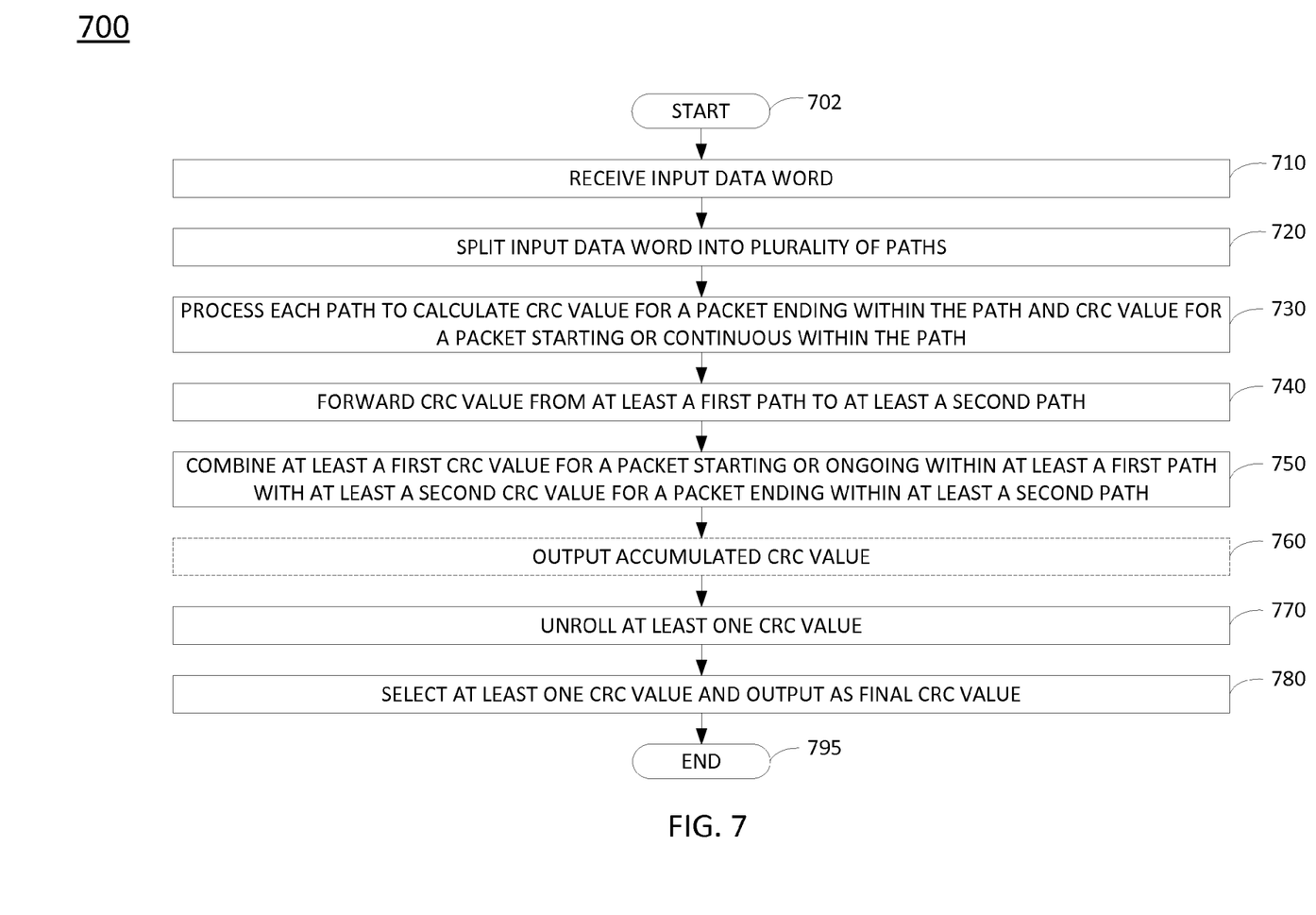
FIG. 7 illustrates a block diagram of a method for performing a cyclic redundancy check.

FIG. 7 illustrates a block diagram of a method 700 for performing a cyclic redundancy check. For example, method 700 can be performed by a circuit/device according to any one or more of the above described embodiments. In one embodiment, a computer-readable medium according to the present disclosure stores a series of instructions which cause a programmable device to be programmed to perform the steps, functions, or operations of the method 700. The method starts in step 702 and proceeds to step 710.

In step 710, the method 700 receives an input data word. For example, the method may receive parallel data via a 1024-bit wide or greater data bus.

In step 720, the method 700 splits the input data word into a plurality of paths. For example, the method may split the data word into several equal sized paths for parallel processing. In one embodiment, each of the paths is 512 bits wide.

In step 730, the method 700 processes each of the paths, e.g., in a parallel manner. In one embodiment, processing each of the paths includes calculating a cyclic redundancy check (CRC) value for a packet ending within the path and calculating a cyclic redundancy check value for a packet starting or ongoing within the path.

In one embodiment, for each path the processing comprises splitting the path into a plurality of lanes. For instance, each of the lanes may comprise an equal number of sequential bytes from the path. In one embodiment, for each lane, the method computes a partial CRC value and forwards the partial CRC value to lanes "below" (broadly other lanes). In one embodiment, the forwarding comprises a matrix transformation of the partial CRC value according to the distance from the current lane to the destination lane. In one embodiment, for each lane the method further combines, e.g., using an exclusive-or operation, the CRC value calculated for that lane with any CRC value(s) forwarded to the lane from any lanes "above" (broadly other lanes). Finally, the method may select a combined CRC value from one of the lanes to output as a CRC value for a packet ending within the path based upon an end of packet signal that may be detected in the particular lane. Likewise, the method may select a combined CRC value for a packet that is starting or continuous through the path to output based upon a default condition (e.g., where there is no start of packet signal detected in any of the lanes, where it is assumed that the packet did not begin in the path and started in some path above or in a prior data word), or based upon the detection of a start of packet signal within one of the lanes.

In step 740, the method forwards a CRC value from at least a first path to at least a second path. For example, a packet may start or be continuous in a first path. Thus, the partial CRC value for packets starting or continuous within the path is combined with other partial CRC values for one or more paths "below" (e.g., the path where the packet ends). In one embodiment, the forwarding comprises a matrix transformation of the partial CRC value according to the destination path. For instance, if a destination path is two paths ahead of the current path, the matrix transformation may be based upon two times the number of bits per path. It should be noted that in one embodiment, step 740 comprises forwarding CRC values from multiple paths to multiple different destination paths. In addition, in one embodiment, an accumulated CRC value from a previous data word may also be forwarded to one or more of the paths at step 740.

In step 750, the method 700 combines at least a first CRC value for a packet starting or ongoing within at least a first path with at least a second CRC value for a packet ending within at least a second path. In one embodiment, the combining comprises performing an exclusive-or operation on the two CRC values. In one embodiment, step 750 includes first checking whether a packet is continuous between the two paths. For example, a same packet may start on the first path and end on the second path. Thus, CRC values from the two paths are combined. However, if there is no continuity of the same packet across the two paths, then the CRC values should not be combined. Alternatively or additionally, in one embodiment step 750 may comprise combining the accumulated CRC value from a previous data word with one or more CRC values from one or more paths of the current data word.

At optional step 760, the method 700 outputs an accumulated CRC value. For example, if a packet is ongoing or continuous in a last path of a data word and the packet does not end within the current data word, the accumulated CRC value should be output and stored for a subsequent iteration of the method 700 with respect to a next data word (where the packet data may end).

At step 770, the method 700 unrolls at least one CRC value. For example, a packet may end at any position within a lane. Thus, the CRC value may need to be adjusted to account for any empty bits between the end of the packet and the end of a lane and/or the end of a path. For example, in one embodiment, the unrolling comprises a matrix transformation of the CRC value according to a generating function/polynomial and a number of empty bits. In one embodiment, step 700 comprises unrolling two or more CRC values. For instance, two or more packets may end within the same data word in the present embodiments. Thus, a separate unrolling operation may be performed at step 770 with respect to each of the CRC values based upon the respective number of empty bits.

At step 780 the method selects one or more CRC values and outputs the CRC values as final CRC values. For instance, one, two or several packets may all end within the same data word. For example, if the word size is N, the path size is 512 and the minimum packet size is also 512, the number of packets potentially ending within the same word is n=N/512. If N=1536, there are three paths and potentially three packets ending within the word. However, while each of the paths may have CRC outputs, not all of the outputs are necessarily valid final CRC values. For instance, a packet may end within the first path and within the last path, but not in the middle path. Thus, at step 780, the method 700 may select only those CRC values which are valid to output as the final CRC values.

Following step 780, the method 700 proceeds to step 795 where the method ends.

It should be noted that although not specifically specified, one or more steps or operations of method 700 may include a storing, displaying and/or outputting step as required for a particular application. In other words, any data, records, fields, tables, and/or intermediate results discussed in the method can be stored, displayed and/or outputted to another device as required for a particular application. Furthermore, steps, operations, or blocks in FIG. 7 that recite a determining operation or involve a decision, do not necessarily require that both branches of the determining operation be practiced. In other words, one of the branches of the determining operation can be deemed as an optional step.

Figure 8:
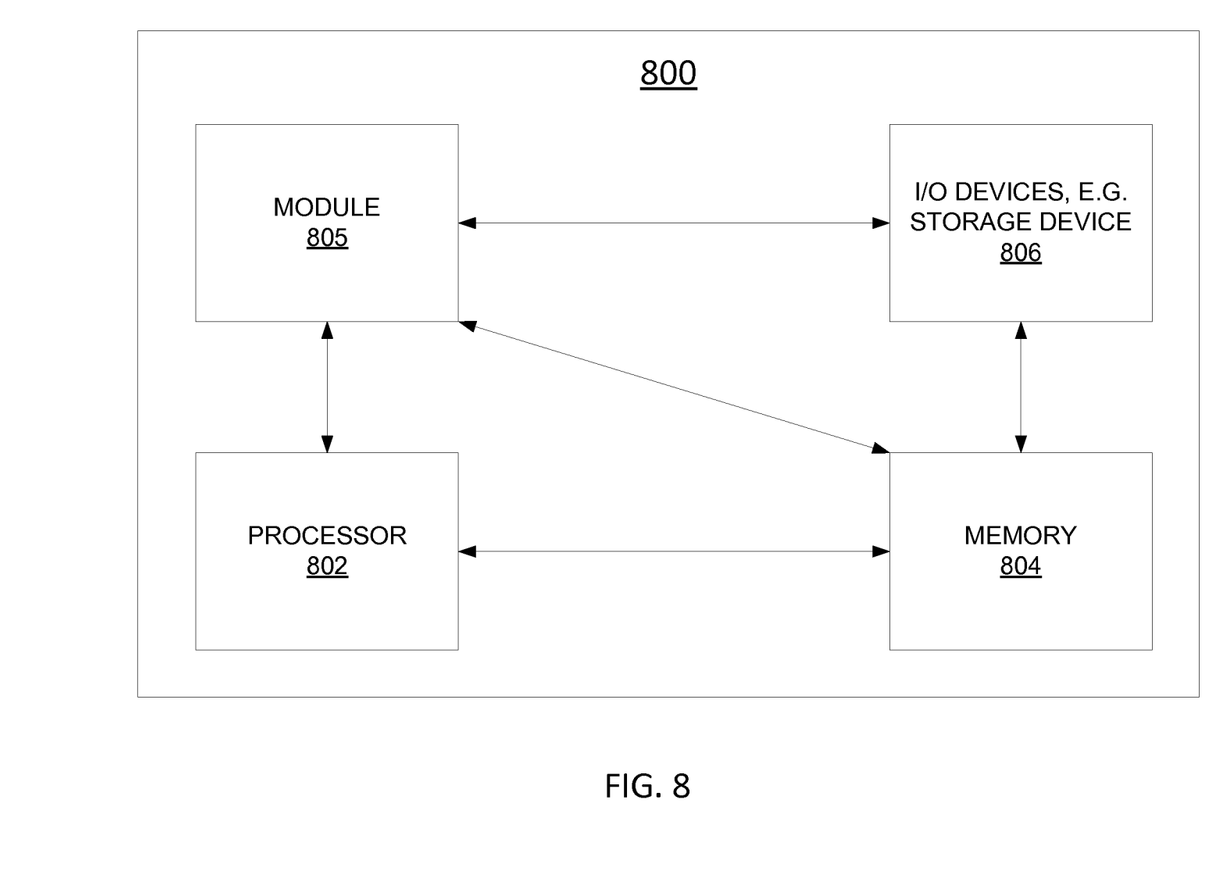
FIG. 8 illustrates a high level block diagram of a general purpose computer or a computing device suitable for use in performing the functions described herein.

FIG. 8 depicts a high level block diagram of a general purpose computer, a computing device, or a computing system 800 suitable for use in performing some or all of the functions described herein. As depicted in FIG. 8, the system 800 comprises a processor element 802 (e.g., a CPU), a memory 804, e.g., a random access memory (RAM) and/or a read only memory (ROM), a module 805 for performing a cyclic redundancy check, and various input/output devices 806 (e.g., storage devices, including but not limited to, a memory device, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

Embodiments of the present disclosure can be implemented in a combination of software and hardware, e.g., using application specific integrated circuits (ASIC), a PLD such as a FPGA, a general purpose computer or any other hardware equivalents such as microprocessors. In one embodiment, the present module or process for performing a cyclic redundancy check can be loaded into memory 804 and executed by processor 802 to implement the functions as discussed above. As such, the present module or process 805 for performing a cyclic redundancy check (including associated data structures) of embodiments of the present disclosure can be stored on a non-transitory computer readable storage medium, e.g., RAM memory, magnetic or optical drive or diskette and the like.

Embodiments of the present disclosure may also be implemented in whole or in part by a tunable IC, e.g., a PLD and/or FPGA. More specifically, a programmable logic device (PLD) is a general-purpose device that can be programmed by a user to implement a variety of selected functions. One type of PLD is a Field Programmable Gate Array (FPGA), which typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data (e.g., from general purpose computer 800) into associated memory cells that control various switches and multiplexers within the CLBs, IOBs, and the interconnect structure to implement logic and routing functions specified by the configuration data to implement a user design in the FPGA. An FPGA may also include other programmable and non-programmable resources. As such, the circuits shown above in connection with FIGS. 1-3 may be implemented in a plurality of CLBs that perform equivalent logic operations of any one or more components of any one or more of the circuits of FIGS. 1-3. For example, embodiments of the present disclosure for performing CRCs on packets received over a 1536-bit wide data bus have been implemented on a FPGA using approximately 15,000 look up tables (LUTs), 3,000 registers and 4,500 slices.

While the foregoing describes exemplary embodiment(s) in accordance with one or more aspects of the present disclosure, other and further embodiment(s) in accordance with the one or more aspects of the present disclosure may be devised without departing from the scope thereof, which is determined by the claim(s) that follow and equivalents thereof. Claim(s) listing steps do not imply any order of the steps. Trademarks are the property of their respective owners.

What is claimed is:

1. A device, comprising:
    a splitter for splitting a data word comprising a plurality of bits into a plurality of paths, wherein each path of the plurality of paths carries a subset of the plurality of bits;
    a plurality of cyclic redundancy check units, wherein each of the cyclic redundancy check units is for processing a respective one of the paths, wherein each of the cyclic redundancy check units comprises:
        a first output port for outputting a first cyclic redundancy check value for a first packet that ends within the subset of the plurality of bits processed by the cyclic redundancy check unit; and
        a second output port for outputting a second cyclic redundancy check value for a second packet that starts or is ongoing within the subset of the plurality of bits processed by the cyclic redundancy check unit.

2. The device of claim 1, wherein a size of the packet that is processed by each of the cyclic redundancy check units, is at least a path size of each of the paths.

3. The device of claim 1, further comprising:
    at least one combiner for combining a cyclic redundancy check value for a packet starting or ongoing within a first one of the plurality of cyclic redundancy check units with a cyclic redundancy check value for a packet ending within a second one of the plurality of cyclic redundancy check units.

4. The device of claim 3, wherein the at least one combiner is for performing an exclusive-or operation on the cyclic redundancy check value for the packet starting or ongoing within the first one of the plurality of cyclic redundancy check units and the cyclic redundancy check value for the packet ending within the second one of the plurality of cyclic redundancy check units.

5. The device of claim 3, wherein the packet starting or ongoing within the first one of the plurality of cyclic redundancy check units and the packet ending within the second one of the plurality of cyclic redundancy check units are a same packet.

6. The device of claim 3, further comprising:
    at least one check circuit for checking whether the packet that is processed by each of the cyclic redundancy check units, is continuous between two cyclic redundancy check units of the plurality of cyclic redundancy check units.

7. The device of claim 6, wherein the check circuit determines that the packet is contiguous between the two cyclic redundancy check units when a start-of-packet signal is found in a first path associated with a first cyclic redundancy check unit of the two cyclic redundancy check units or the packet is ongoing in the first path, and when an end-of-packet signal is found in the second path associated with the second cyclic redundancy check unit of the two cyclic redundancy check units.

8. The device of claim 1, wherein each of the cyclic redundancy check units further comprises:
    a splitter for splitting one of the paths into a plurality of lanes; and
    a plurality of cyclic redundancy check modules for calculating a partial cyclic redundancy check value of bits of a respective one of the plurality of lanes.

9. The device of claim 8, wherein each of the cyclic redundancy check units further comprises:
    a selection module for selecting a cyclic redundancy check value for output as the cyclic redundancy check value for the packet ending within the cyclic redundancy check unit.

10. The device of claim 9, wherein the selection module is for selecting the cyclic redundancy check value for output as the cyclic redundancy check value for the packet ending within the cyclic redundancy check unit based on an end-of-packet signal in one of the lanes or based upon a default condition if there is no end-of-packet signal in any of the lanes.

11. The device of claim 8, wherein each of the cyclic redundancy check units further comprises:
    a selection module for selecting a cyclic redundancy check value for output as the cyclic redundancy check value for the packet starting or ongoing within the cyclic redundancy check unit.

12. The device of claim 11, wherein the selection module is for selecting the cyclic redundancy check value for output as the cyclic redundancy check value for the packet starting or ongoing within the cyclic redundancy check unit based on a start-of-packet signal in one of the lanes or based upon a default condition if there is no start-of-packet signal in any of the lanes.

13. The device of claim 8, wherein each of the cyclic redundancy check units further comprises:
    at least one combiner for combining a partial cyclic redundancy check value from at least a first cyclic redundancy check module and a partial cyclic redundancy check value from at least a second cyclic redundancy check module to output a cyclic redundancy check value for a respective one of the lanes associated with the second cyclic redundancy check module.

14. The device of claim 8, wherein each of the cyclic redundancy check units further comprises:
   at least one forwarding module for bit-forwarding at least one partial cyclic redundancy check value based upon a number of bits between a lane of the at least one forwarding module and a destination lane.

15. The device of claim 1, further comprising:
   an input port for receiving an accumulated cyclic redundancy check value from a previous data word; or
   an output port for outputting an accumulated cyclic redundancy check value for a next data word.

16. The device of claim 15, further comprising:
   at least one combiner for combining the accumulated cyclic redundancy check value with at least one cyclic redundancy check value for a packet ending within at least one of the cyclic redundancy check units.

17. The device of claim 1, further comprising:
   at least one forwarding unit for bit-forwarding at least one cyclic redundancy check value based upon a number of bits between a respective path of the at least one forwarding unit and a destination path.

18. The device of claim 1, further comprising:
   at least one unrolling unit for unrolling at least one cyclic redundancy check value based upon a number of empty bits between an end of a packet and an end of a lane or between the end of the packet and an end of a path.

19. A method, comprising:
   splitting a data word comprising a plurality of bits into a plurality of paths, wherein each path of the plurality of paths carries a subset of the plurality of bits; and
   processing each of the paths, wherein for each path the processing comprises:
      calculating a first cyclic redundancy check value for a first packet that ends within the subset of the plurality of bits carried by the path; and
      calculating a second cyclic redundancy check value for a second packet that starts or is ongoing within the subset of the plurality of bits carried by the path.

\* \* \* \* \*